United States Patent
Gotham et al.

(10) Patent No.: US 8,537,531 B2
(45) Date of Patent: *Sep. 17, 2013

(54) COVER GLASS TO HOUSING INTERFACE SYSTEM

(75) Inventors: Todd F. Gotham, Campbell, CA (US); Shin Nishibori, Portola Valley, CA (US); Christopher J. Stringer, Woodside, CA (US); Michael McBroom, Leonard, TX (US); Daniel McBroom, Leonard, TX (US); Brian Sudderth, Leonard, TX (US); John Ternus, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 174 days.

This patent is subject to a terminal disclaimer.

(21) Appl. No.: 13/107,808

(22) Filed: May 13, 2011

(65) Prior Publication Data

US 2011/0216494 A1 Sep. 8, 2011

Related U.S. Application Data

(63) Continuation of application No. 12/570,972, filed on Sep. 30, 2009.

(51) Int. Cl.
*G06F 1/16* (2006.01)

(52) U.S. Cl.
USPC ....... 361/679.21; 455/557; 345/175; 349/141

(58) Field of Classification Search
USPC .................. 455/557, 11.1, 343.5, 566, 556.1, 455/575.1, 90.3, 419, 466; 439/345; 345/60, 345/173, 102, 87, 80, 175; 349/106, 158, 349/143, 114, 110, 141; 361/679.21, 679.08, 361/679.47, 679.01, 679.02, 679.46, 679.54, 361/679.09
See application file for complete search history.

(56) References Cited

U.S. PATENT DOCUMENTS

| | | | |
|---|---|---|---|
| 3,937,387 A | 2/1976 | Fletcher et al. | |
| 4,760,240 A | 7/1988 | Iikawa et al. | |
| 5,708,895 A | 1/1998 | Ando et al. | |
| 6,125,029 A | 9/2000 | Sasaki et al. | |

(Continued)

FOREIGN PATENT DOCUMENTS

| JP | 2007-3698 | 1/2007 |
|---|---|---|
| JP | 2008-137074 | 6/2008 |

OTHER PUBLICATIONS

U.S. Appl. No. 12/570,972, filed Sep. 30, 2009.
U.S. Appl. No. 11/829,845, filed Jul. 27, 2007.

(Continued)

*Primary Examiner* — Hung Duong

(57) ABSTRACT

A display cover to housing interface system includes a display screen fronted by a display cover having front and obverse faces and a distal edge between the faces around a circumference thereof (i.e., edge thickness), and also an outer housing that provides support for the display cover. A portion of the display cover distal edge or thickness is fully exposed to outside, such that the display cover is exposed and substantially visible when viewed directly from the front and at least one side while installed. The display cover can be glass, while the housing is metal. A protective layer located between the housing and display cover protects the display cover from the housing. Various support components hold the display cover in place, and can include magnets and/or a stabilizer assembly affixed along a bottom edge of the display cover and adapted to couple to a bottom chin of the housing.

20 Claims, 11 Drawing Sheets

(56) References Cited

U.S. PATENT DOCUMENTS

| | | |
|---|---|---|
| 6,437,974 B1 | 8/2002 | Liu |
| 6,574,096 B1 | 6/2003 | DiFonzo et al. |
| 6,626,303 B1 | 9/2003 | Moodie |
| 7,399,083 B2 | 7/2008 | Bailey et al. |
| 7,965,498 B2 * | 6/2011 | Gotham et al. .......... 361/679.21 |
| 2003/0161142 A1 | 8/2003 | Kotivsky |
| 2004/0232291 A1 | 11/2004 | Carnevali |
| 2005/0284993 A1 | 12/2005 | Ternus et al. |
| 2007/0041153 A1 * | 2/2007 | Jackson, Jr. .................. 361/683 |
| 2007/0132910 A1 | 6/2007 | Liao |
| 2007/0291901 A1 | 12/2007 | Warburton |
| 2008/0063218 A1 | 3/2008 | Weber et al. |
| 2008/0247750 A1 | 10/2008 | Law et al. |
| 2009/0040703 A1 | 2/2009 | Gotham et al. |
| 2009/0244853 A1 | 10/2009 | Takahashi |
| 2009/0246934 A1 | 10/2009 | Yamazaki et al. |
| 2009/0266621 A1 | 10/2009 | Hung et al. |
| 2010/0225612 A1 | 9/2010 | Ishizaki |
| 2011/0090627 A1 * | 4/2011 | Raff et al. ................. 361/679.02 |

OTHER PUBLICATIONS

Notice of Allowance for U.S. Appl. No. 12/570,972 dated Feb. 28, 2011.
Office Action for U.S. Appl. No. 11/829,845 dated Mar. 13, 2009.
Final Office Action for U.S. Appl. No. 11/829,845 dated Sep. 18, 2009.
Office Action for U.S. Appl. No. 11/829,845 dated Apr. 9, 2010.
Office Action for U.S. Appl. No. 11/829,845 dated Jul. 16, 2010.
Office Action for U.S. Appl. No. 11/829,845 dated Feb. 4, 2011.
Final Office Action for U.S. Appl. No. 11/829,845 dated Jul. 20, 2011.
Office Action for U.S. Appl. No. 11/829,845 dated Mar. 1, 2012.
U.S. Appl. No. 12/571,122, filed Sep. 30, 2009.

\* cited by examiner

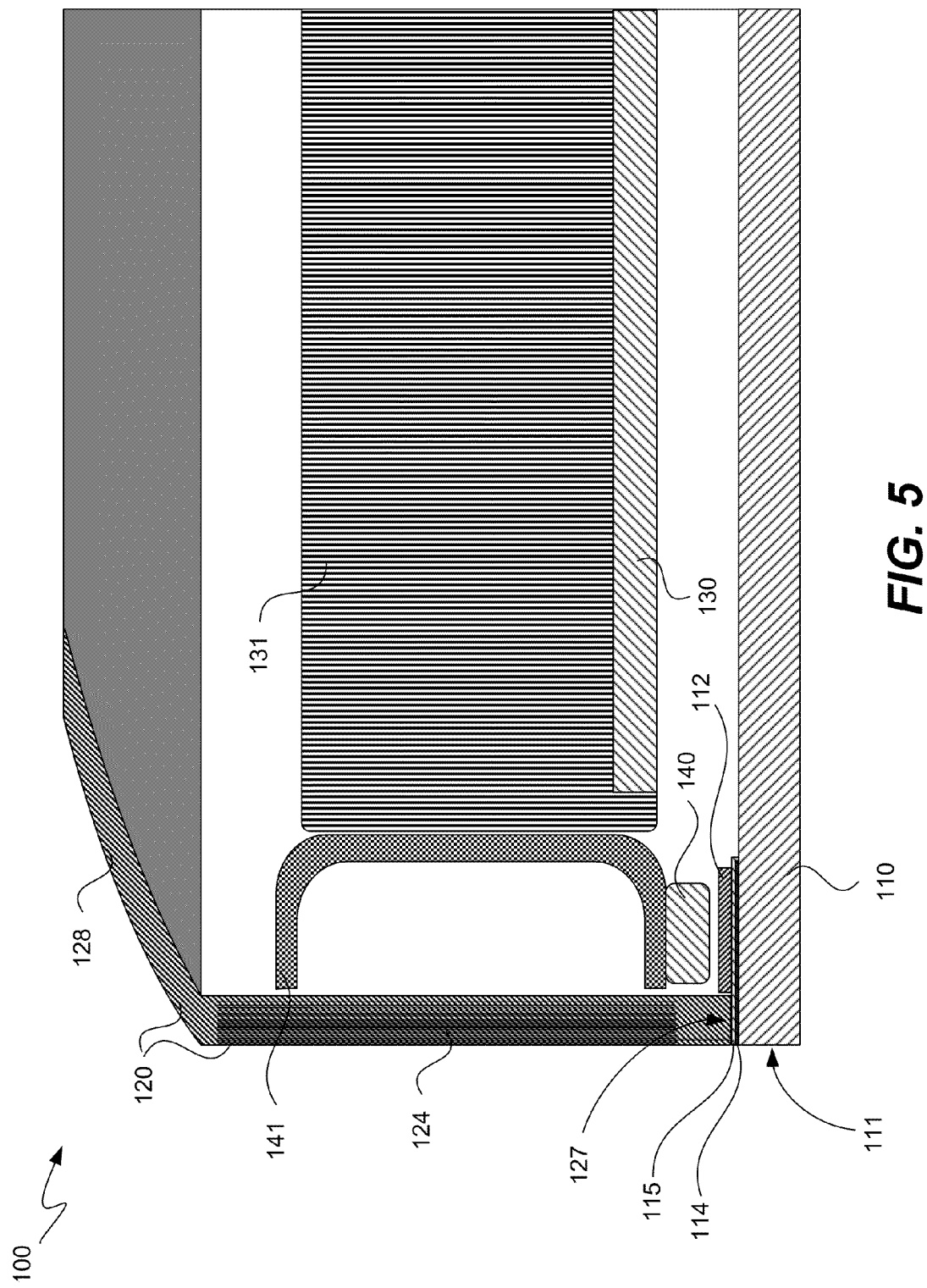

COVER GLASS TO HOUSING INTERFACE SYSTEM

CROSS REFERENCE TO RELATED APPLICATIONS

This application is a continuation of and claims priority to co-pending U.S. patent application Ser. No. 12/570,972, filed Sep. 30, 2009, entitled "COVER GLASS TO HOUSING INTERFACE SYSTEM," which is incorporated herein by reference in its entirety and for all purposes. This application is also related to co-pending and commonly owned U.S. patent application Ser. No. 12/571,122, also filed Sep. 30, 2009, entitled "COMPUTER HOUSING, which is also incorporated by reference herein in its entirety and for all purposes.

TECHNICAL FIELD

The present invention relates generally to display devices, and more particularly to methods and systems for interfacing a display cover to a metal housing on a computer or other device having a display screen.

BACKGROUND

Sophisticated computers, terminals, televisions, and other devices that utilize display screens are developing at a rapid rate. In such competitive markets with many brands and providers, there is an ever-present demand for improved and/or distinguished appearances, functionalities, and aesthetics in the newest computers and other similar devices. One area that continually receives great attention for improved and distinguished appearances in such devices involves visual outputs, which can include display screens, lights and other variable visual indicators. As consumer products grow more complex with greater capabilities, and with so many providers and competing products to choose from, however, it becomes increasingly difficult to provide products having display screens that are distinguished and eye-catching, yet uncluttered and aesthetically pleasing.

For example, significant strides have been made in recent years with respect to display screens for laptop computers. Newer technologies have resulted in laptop computer makers being able to mass produce display screens that are clearer, thinner and larger in area, while producing less heat than in earlier models. In addition, the materials used to house and support laptop display screens, typically in one half of a clamshell type arrangement, have become stronger and arranged better in recent years. This enables the ability to use less plastic or other material to support and "frame" the display screen, which can then result in more area dedicated to the display screen itself and a more aesthetic display appearance.

Another more particular example of a distinguished and aesthetically pleasing large display screen presentation can be found with respect to the iMac® personal computer made by Apple, Inc. of Cupertino, Calif. In this display presentation, a large display screen is secured within an outer housing having a back, bottom, relatively thin sides and top, and a large opening in the front that comprises over 75% of the frontal area. A display cover glass is positioned into and held in place in a set back recess in the frontal opening area of the outer housing specifically designed to secure the cover glass, such that the display screen is visible therethrough. An inked mask around the display cover glass edge, rounded housing corners and a metallic finish augment the overall appearance. The end result is an aesthetically pleasing look dominated by a relatively large display screen that is visible to the user through a display cover glass and positioned within an outer housing that does not require substantially more height or width than the display screen itself.

While many designs and techniques used to present a display screen have generally worked well in the past, there is always a desire to provide further designs and techniques for presenting display screens that are aesthetically pleasing and distinguishable over the presentations of other providers and brands. In addition, such aesthetically pleasing yet distinguishable approaches can lead to a need for new structures and interfaces to enable the new presented displays to be integrated with their respective devices in a non-obtrusive manner.

SUMMARY

It is an advantage of the present invention to provide distinctive display arrangements that are fully functional as well as aesthetically pleasing. This can be accomplished at least in part through the use of an original display cover to outer housing interface, along with various support structures that enable such a unique arrangement. The use of an outer housing having a bottom chin and side to side stabilizer components permits the display cover to rest flush against the bottom chin, while upper support components hold the upper portion of the display cover in place such that the side edges of the display cover are exposed and visible to a user viewing the system directly from the side.

In various embodiments, a display cover to housing interface system can include a translucent or transparent display cover having a distal edge portion or thickness and adapted to be placed proximate to a display screen such that the display screen is visible therethrough, as well as a housing adapted to house the display screen and provide stabilized support for the display cover while the display cover is placed proximate to the display screen, wherein at least a portion of the display cover distal edge portion or thickness is fully exposed to the outside of the system while such stabilized support is provided. The display cover can include a front face, an obverse face and the distal edge portion (i.e., thickness) between the front and obverse faces and around at least a portion of a circumference thereof. Also, the stabilized support can comprise a force interaction between one or more distal edges of the housing and the obverse face of the display cover. Although the display cover can be glass and the housing can be metal, other materials can be used. The display cover can also be readily removable from the housing, such that the obverse side of the display cover can be easily cleaned by a user, and/or the internal cavity of the housing can be readily accessed for servicing. Enabling such accessibility to the internal cavity of the housing through the opening created by a vacated display cover can permit the remainder of the housing to be a single integrated unit.

In some embodiments, a protective layer can be situated between one or more distal edges of the housing and the obverse face of the display cover, with said protective layer being adapted to prevent or reduce damage resulting from said the housing contacting the display cover, particularly where the housing is made of metal. In some embodiments, an ink layer can be situated between the protective layer and the obverse face of the display cover, with said ink layer being arranged to form an opaque frame around a viewing portion of the display cover. The protective layer can also be arranged to protect this ink layer from being scratched or otherwise damaged by the housing. Such an ink layer can be deposited or otherwise place on the obverse side of the display cover itself.

In some embodiments, one or more support components can be used to hold the display cover in place with respect to the housing, and such support components can restrict relative movement of the display cover in a direction substantially perpendicular to its front face. In some embodiments, such support components can include the use of magnets coupled to the housing and/or display screen structure. In such an arrangement, one or more pieces of metal can be bonded to the obverse face of the display cover, wherein the magnets are arranged to hold the display cover in place by exerting an attraction force on the one or more pieces of metal bonded to the display cover.

In various detailed embodiments, a stabilizer assembly can be affixed along an outer edge of the display cover, such as along a bottom edge, with such a stabilizer assembly being adapted to couple to at least a portion of the housing such that relative side-to-side movement between the display cover and the housing is restricted. The housing can have a bottom chin portion that is specially adapted to mate or otherwise interface with the stabilizer assembly affixed to the display cover. This bottom chin portion can be adapted to reside directly beneath and to support the display cover, wherein the front of said bottom chin portion extends further away from the display screen than any other portion of the housing. In some arrangements, the front of this bottom chin portion and the front face of the display cover can be coplanar. In addition, the display cover can rest flush against the bottom chin such that no gap between the display cover and housing is created.

In various further embodiments, a computing device can include a microprocessor, a display screen coupled to the processor, a display cover positioned proximate to said display screen such that at least a portion of the display screen, and an outer housing containing the display screen and providing stabilized support for the display cover. The display cover and outer housing can be substantially similar to the display cover and housing set forth above, and it is specifically contemplated that such that such items be arranged so that at least a portion of the display cover distal edge or thickness is fully exposed to the outside of the computing device while such stabilized support is provided.

Further embodiments can include just the display apparatus, including a display screen, a display cover as set forth above, and an outer housing as set forth above. Again, the front portion of the housing and the front face of the display cover can be coplanar. Also, the face of the distal edge portion of the display cover and the face of said at least one side of the outer housing can also be coplanar. Still, further, the full thickness of the display cover can be exposed and visible from the side when the entire system is viewed directly from the side. Such a side coplanar relationship and such a side visibility feature can exist for any other embodiments provided herein.

In various detailed embodiments, which may be included in any of the foregoing embodiments, the display cover has a square or rectangular shape. In such arrangements, the display cover distal edge portion can be exposed on at least two different sides of the square or rectangle. In further arrangements, the display cover distal edge portion can be exposed on at least three entire sides of the square or rectangle. In still other arrangements, the entire circumference of the distal edge portion (i.e., all four sides) is exposed to outside of the computing device.

In still further embodiments, various methods of placing a display cover onto a computing device having a display screen are provided. Such methods can include positioning a bottom edge of a display cover onto a bottom chin portion of an outer housing having a display screen housed therein, engaging a stabilizer assembly affixed to and along the bottom edge of the display cover with one or more mating components coupled to said bottom chin portion, pivoting the display cover toward the display screen about an axis of rotation that is substantially along the bottom edge of the display cover, and releasing the display cover such that an upper portion thereof is supported by one or more secondary supports located on the computing device. As noted above, such a step of releasing can include permitting a plurality of magnets (i.e., secondary supports) located on the computing device to attract one or more metal items located on the display cover.

In various detailed embodiments, which may similarly be included in any of the foregoing embodiments, the display cover can be advantageously positioned such that the bottom chin portion provides a primary support therefor. The stabilizer assembly engagement can then restrict any relative side-to-side movement between the display cover and the outer housing. Further, the final position of the display cover can result in a substantial amount of the side thickness of the display cover being exposed to the outside of the computing device. The step of releasing can include permitting a plurality of magnets located on the computing device to attract one or more metal items located on the display cover.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatus and method for providing a display screen cover to housing interface for a personal computer or other device having a display screen. These drawings in no way limit any changes in form and detail that may be made to the invention by one skilled in the art without departing from the spirit and scope of the invention.

FIG. 5 illustrates in partial top cross-sectional view the fully assembled exemplary computing device of FIG. 2A according to one embodiment of the present invention.

DETAILED DESCRIPTION

Figure 1A:
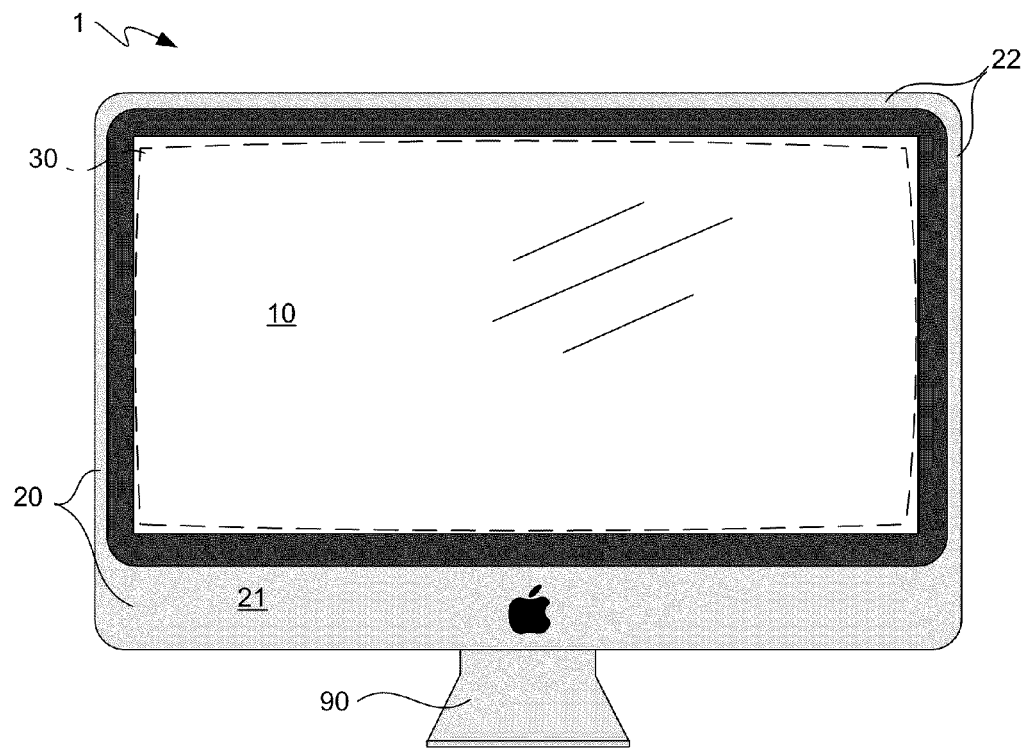
FIG. 1A illustrates in front elevation view an exemplary computing device having an oversized display screen presentation.

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

The invention relates in various embodiments to a display cover to housing interface system for a device having a visual display. Various types of displays that can be associated with such an interface system and associated device can include, for example, various CRT, LCD, or plasma displays, as well as various LED arrangements or any other device used to present a visual display to a viewer. Associated devices having such a visual display and interface system can be, for example, a television, terminal, monitor or integrated computing device, among other possibilities that have display screens. One particular example of an integrated computing device can be an iMac® personal computer made by Apple Inc., as well as other similar integrated computing devices. Other possibilities that may utilize such an interface system can include various handheld media devices, such as the iPod® and iPhone® personal handheld media devices, also made by Apple Inc.

In various embodiments of the present invention a display cover is placed proximate to the viewing area of an associated display screen, which again can be any type of display screen used to present a visual display to a viewer. It will be readily appreciated that such a display cover can be separate from the display screen itself. In fact, such display covers are often used to provide additional protection and distance from the securely installed and specially treated glass or other substance that forms a front screen part of the CRT, LCD, plasma display or other display device. It will be readily appreciated that such a display cover may be separated from the display device itself, and that such a display cover may also be referred to as a cover glass, safety panel or other suitable designation. While such a display cover, cover glass or safety panel can typically be comprised of glass, it will be understood that various types of plastics and/or other suitable transparent or translucent materials may alternatively be used to form the display cover or cover glass.

Figure 1B:
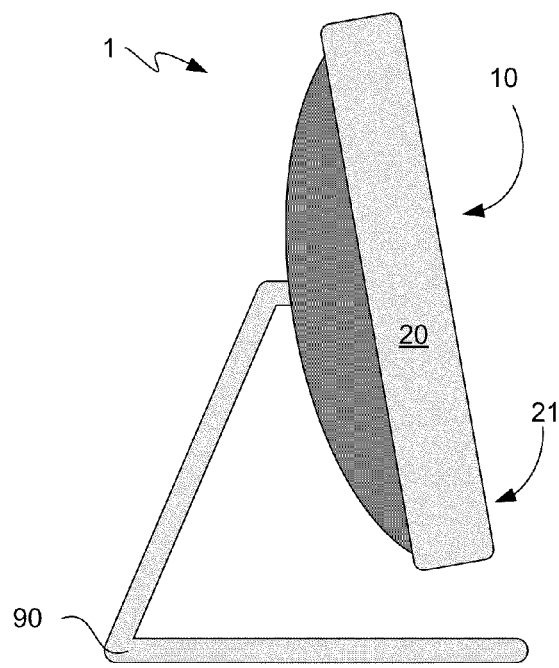
FIG. 1B illustrates in side elevation view the exemplary computing device of FIG. 1A.

Referring first to FIGS. 1A and 1B an exemplary computing device having an oversized display screen presentation is illustrated in front elevation and side elevation views respectively. Computing device 1 can be, for example, an iMac® personal computer commercially available from Apple, Inc., although it will be readily understood that a wide variety of computing devices or other items having a display screen might also have a similar oversized display screen presentation. Computing device 1 can have a display cover 10 fitted on or within an outer housing 20. As can be seen, the display screen presentation can be termed "oversized" due to the large amount of display area relative to the overall front area of the computing device 1. Display cover 10 is placed proximate to and in front of a display device 30 contained within outer housing 20. It will be appreciated that although display cover 10 and display screen 30 are shown as being generally rectangular, various other shapes and sizes for these items may also be used. Outer housing 20 can have a frontally offset bottom portion 21 that borders a bottom of the display cover 10, as well as a raised frame 22 that surrounds the rest of the display cover. A recessed set back region (not shown) can be formed above the bottom portion 21 and/or just inside the frame 22 of the outer housing 20, such that display cover 10 can be readily secured and supported within the outer housing. In addition, a stand 90 or other similar structure can be used to support the entire computing device 1.

As seen in FIGS. 1A and 1B, raised frame 22 of outer housing 20 can essentially form a plurality of thin walls having front distal edges, with the walls being arranged to fully surround and cover any edge portions of display cover 10. As such, only the front face of the display cover 10 is exposed to the outside of the computing device 1, and the edge portions or side "thickness" of the display cover are generally not visible to a user viewing computing device 1 directly from the side. Although frame 22 may be relatively thin, as can be seen in FIG. 1A, the overall structure and arrangement of the frame 22, bottom portion 21 and housing 20 in general results in a relatively simple way of securing and supporting the display cover 10 in a suitable location for viewing the display device 30 therethrough. As will be readily appreciated, outer housing 20 can also contain various additional computer components, such as processors, storage units, speakers, additional displays or indicators, buttons or other input devices, video cards, sound cards, power inlets, various ports, and the like. The overall display cover to housing arrangement can be configured to allow the removal of display cover 10 from the remainder of computing device 1 by a user, such as for cleaning the obverse face of the display cover.

Cover to Housing Interface Embodiment I

Figure 2A:
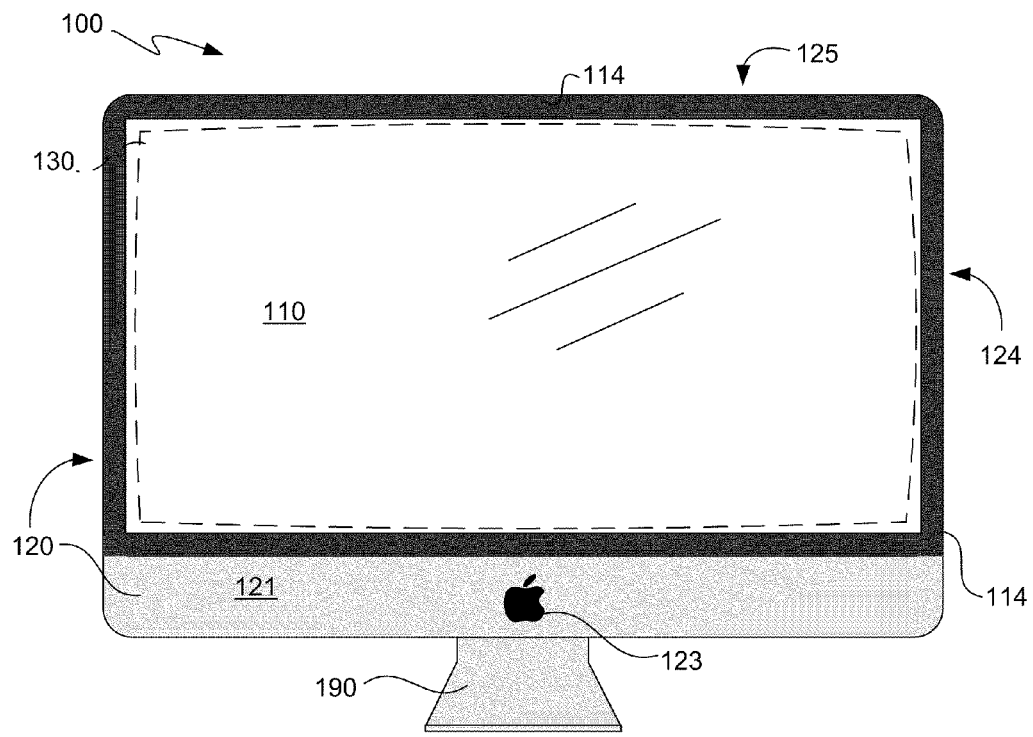
FIG. 2A illustrates in front elevation view an exemplary computing device having an oversized display screen presentation utilizing a display screen to housing interface according to one embodiment of the present invention.
Figure 2B:
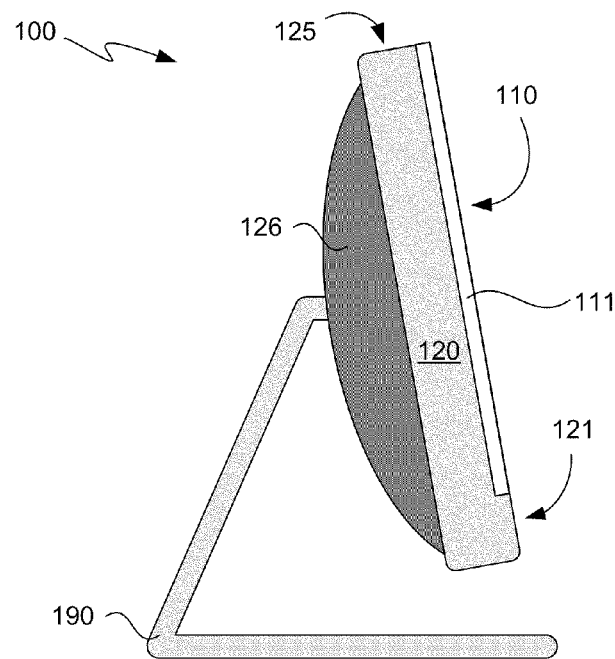
FIG. 2B illustrates in side elevation view the exemplary computing device of FIG. 2A according to one embodiment of the present invention.

Turning now to FIGS. 2A and 2B, an exemplary computing device having an oversized display screen presentation utilizing a display screen to housing interface according to one embodiment of the present invention is illustrated in front elevation and side elevation views respectively. Computing device 100 can be a desktop computer or associated monitor as shown, although various other devices having the distinctive display to housing interface disclosed herein may also be used. Similar to computing device 1 above, computing device 100 can have a display cover 110 disposed with respect to an outer housing 120. Display cover 110 is preferably placed proximate to and in front of a display device 130 that is enclosed within outer housing 120. Outer housing 120 can also enclose various other computer components, such as a microprocessor (not shown) coupled to the display device 130, as well as one or more memory or storage units, speakers, additional displays or indicators, buttons or other input devices, video cards, sound cards, power inlets, various ports, and the like. Alternatively, the depicted computing device 100 may only comprise a monitor, terminal or other simple display unit, with any associated processors or other computing components being located away from the depicted display device.

Outer housing 120 can have a frontally offset bottom chin portion or region 121 that borders a bottom side edge of the display cover 110. Chin region 121 can be entirely or substantially monochromatic, and may have a logo 123 or other contrasting symbol or display disposed thereupon. In addition, outer housing 120 can also have one or more side walls 124 and a top wall 125 that extend backwards from the front face of computing device 100, as well as a back wall 126. Such a back wall 126 may have some amount of curvature to it in various directions, and outer housing 120 may form a single integrated unit comprising chin region 121, side walls 124, top wall 125 and back wall 126, as will be readily appreciated. In addition, a stand 190 or other similar structure can be used to support the entire computing device 100.

The display cover 110 can be relatively thin in nature, and preferably has a front face that is exposed to the outside of computing device 100, an obverse face that is placed proximate to display device 130 and is thus inside of the computing device, and a distal edge portion 111 between the front and obverse faces and around an outer circumference of the display cover. This distal edge or edge portion 111 essentially reflects the thickness of the display cover 110 at its outer side or sides, and comprises the actual face of the outer edges. Such a thickness of the edge portion at the outer edges can vary, and may even become zero at some locations, such as in the case of a sharp edge to the cover glass. Although various embodiments are certainly possible, it is specifically contemplated that the thickness of this outer edge portion remains substantially constant around the full circumference of the display cover 110.

Unlike the computing device 1 set forth in FIGS. 1A and 1B above, outer housing 120 of computing device 100 generally does not have any raised frame or side walls that surround and support the top or side edges of display cover 110. As such, the distal edge portion or portions 111 of the display cover 110 are visible and fully exposed to the outside of the computing device 100, such that a user viewing the computing device directly from the side or top can easily see the respective exposed side or top distal edge portions of the display cover. The result is a distinctive "apparently floating" display cover appearance for the display arrangement specifically, and the overall computing device in general, that is aesthetically pleasing while remaining fully functional with respect to display presentation capabilities.

While this "apparently floating" display cover arrangement may provide a distinguished yet elegant and aesthetically pleasing presentation with respect to many conventional display screen presentations, such an arrangement still requires adequate support in various pertinent directions for the display cover. Although gluing, bonding or otherwise permanently affixing the display cover to various portions of the housing and/or display apparatus might present a simplistic solution to such support issues, a permanent affixing of the display cover can present a disadvantageous situation with respect to the display cover not being removable. Having a firmly secured and supported yet readily removable display cover is desirable for several reasons. For example, some users may wish to be able to remove the display cover to clean its obverse face, such as where spills, cigarette smoke or other pollutants may have seeped into the device and stained or clouded the back or obverse side of the cover glass. In addition, a user may wish to replace or service the actual display assembly and/or various other components internal to the outer housing. Access thereto can be greatly enhanced, particularly where the outer housing comprises a singular integrated unit having the opening for the display cover as its only large access opening. Thus, a removable display cover is preferable.

A variety of apparatuses and techniques can be used to secure and support the "apparently floating" display cover 110 to the outer housing 120, while still allowing the display cover to be readily removable from the housing. Moving next to FIG. 3, the exemplary computing device of FIG. 2A with its display cover removed is shown in front elevation view. With the display cover removed from computing device 100, the internal display screen 130 and its associated display device chassis or assembly 131 are exposed to the outside the device via its front. Chin region 121 remains at a set forward position with respect to the remainder of outer housing 120. The front facing distal edges 127 of side walls 124 and top wall 125 of outer housing 120 are visible from the front of computing device 100 with the display cover removed. As will be appreciated, particularly with respect to FIGS. 2A and 2B, the display cover fronts and obscures these front distal edges of side walls 124 and top wall 125 when the display cover is installed, such that these edges only become exposed when the display cover is removed. In fact, these front distal edges 127 are preferably not even visible when the display cover is installed, due to a masking layer disposed on or about the display cover, as set forth in greater detail below.

Figure 3:
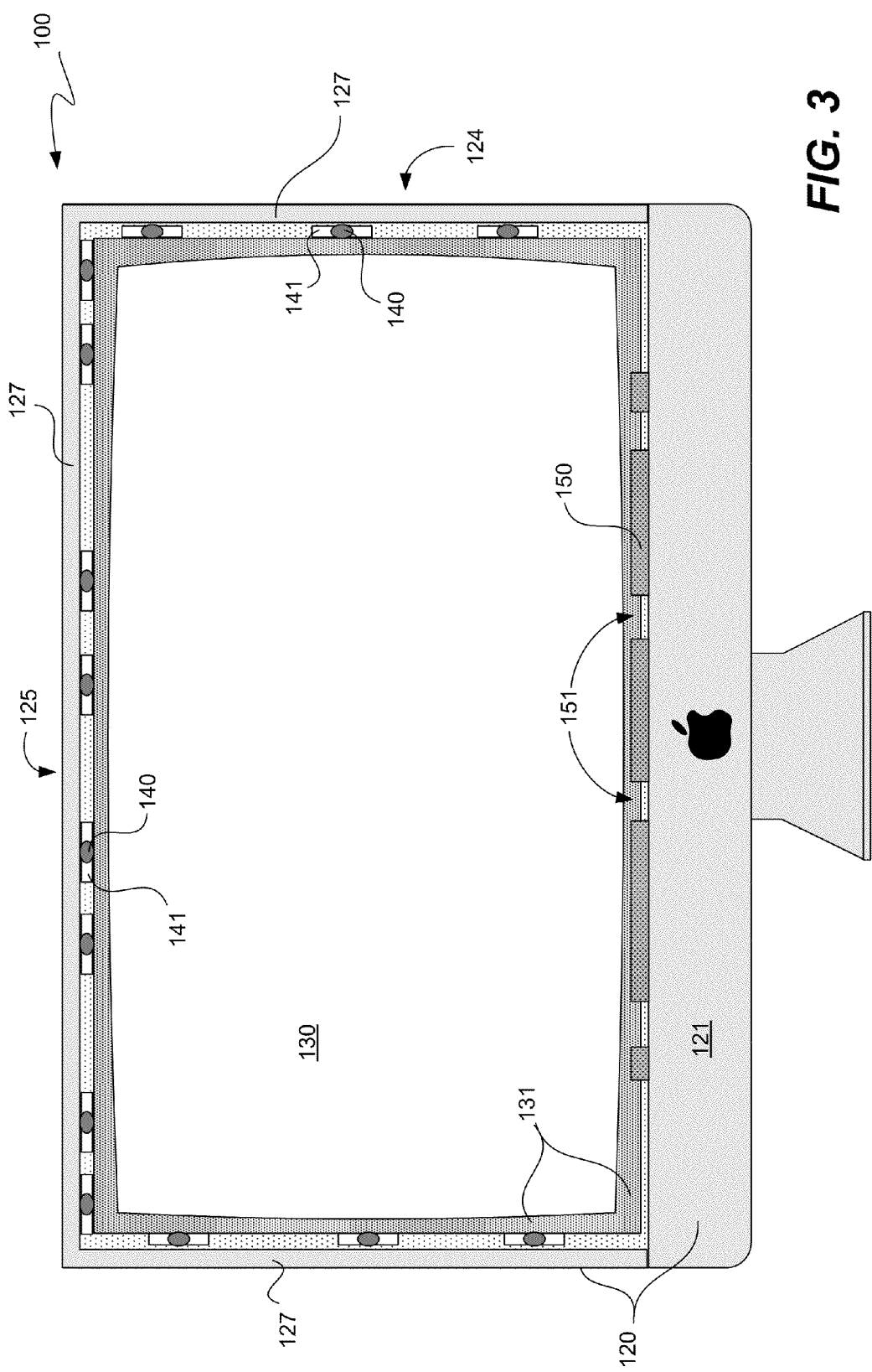
FIG. 3 illustrates in front elevation view the exemplary computing device of FIG. 2A with its display cover removed according to one embodiment of the present invention.

Various support components can be used to secure and support the display cover while it is installed. For example, a plurality of magnets 140 can be disposed on or about the outer housing 120 and/or display device assembly 131, which magnets can be used to attract one or more metallic items disposed within or on the display cover to hold the display cover in place. As shown in FIG. 3, eight magnets 140 are positioned along a top edge of the display device assembly 131, while three magnets 140 are positioned along both of the left and right sides of the display device assembly. Of course, a different number and/or size of magnets can be placed in any particular region, as may be desired. It is thought that having a greater number of magnets across the top may be desirable, as this is where it can be advantageous to have a greater attraction force with the display cover to prevent the display cover from pivoting along its bottom axis to fall away from the overall device. Each of these magnets 140 is coupled to a display bracket 141, which is in turn connected to the display device assembly 131. Of course, magnets 140 and their supporting brackets 141 could also be connected to any of various other items within computing device 100, such as the outer housing 120 or any other stable component.

Although not shown, such support magnets might also be provided on or about the top of chin region 121 to correspond to a bottom edge of the display cover, as may be desired. In addition, or alternatively, a separate stabilizer assembly and associated components can be used to secure the bottom edge of the display cover. A toothed ledge 150 can be provided with respect to bottom chin region 120 in order to engage such a stabilizer assembly, which may be coupled to or integrally formed with the display cover. Ledge 150 may be integrally formed as a part of chin region 121 and outer housing 120, or the ledge may be affixed or otherwise firmly coupled to the outer housing such that it does not move with respect to the housing. For example, ledge 150 may be affixed to and extend upward from the backside of chin region 121, as set forth in greater detail below. Various gaps 151 can be provided within ledge 150 to enable engagement with a stabilizer assembly associated with the display cover when it is installed. As will be readily appreciated, lateral or side-to-side motion of the display cover with respect to outer housing 120 can be restricted when one or more items coupled to the display cover, such as a stabilizer assembly, are inserted into gaps 151 in ledge 150.

Figure 4A:
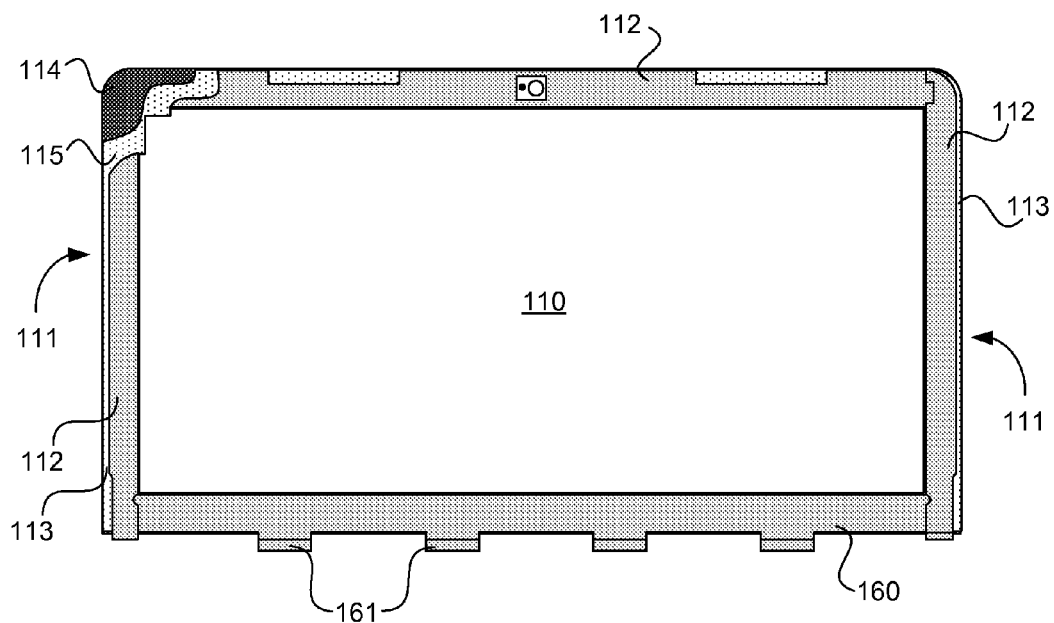
FIG. 4A illustrates in partially cut-away obverse elevation view the obverse side of the display cover removed from the exemplary computing device of FIG. 2A according to one embodiment of the present invention.
Figure 4B:
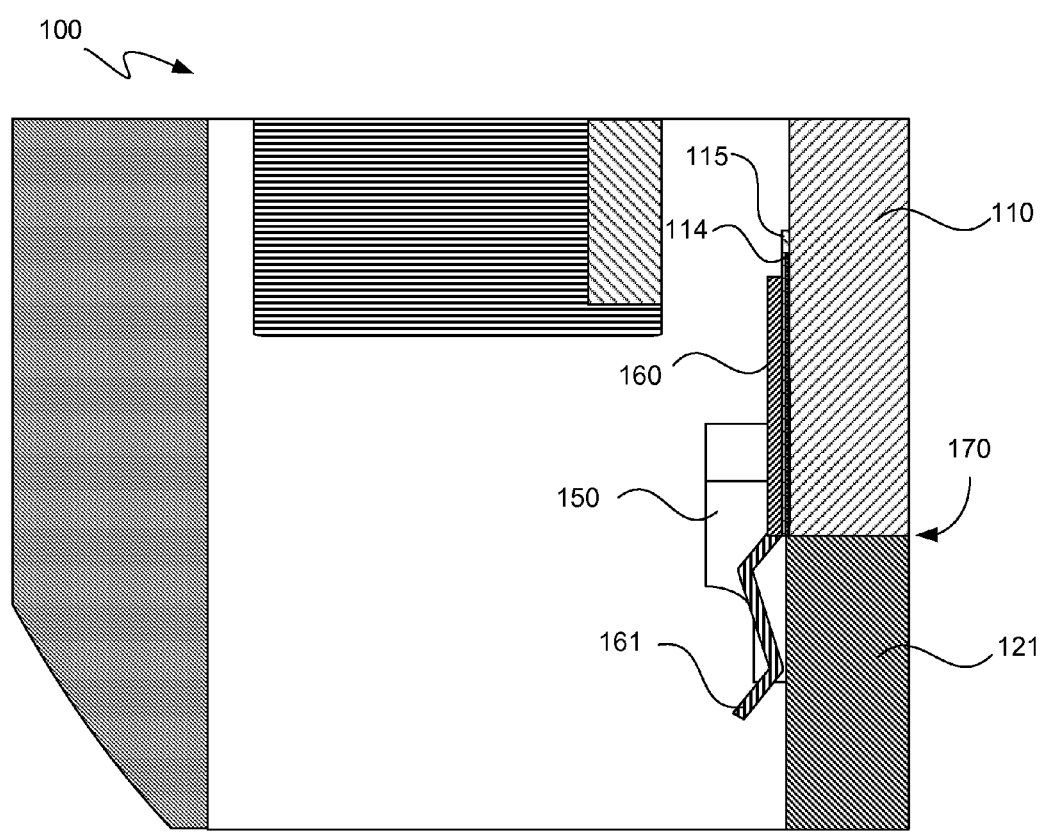
FIG. 4B illustrates in side elevation view the display cover of FIG. 4A according to one embodiment of the present invention.

Magnets 140 and ledge 150 preferably have components to interact with on the display cover in order to be effective. FIG. 4A illustrates in partially cut-away obverse elevation view the obverse face of display cover 110 removed from the exemplary computing device of FIG. 2A, while FIG. 4B depicts display cover 110 in side elevation view. Again, display cover 110 has a distal edge region 111, which can be comprised of two side distal edges and a top distal edge, as shown. Although display cover 110 forms a rectangular shape in the illustrated example, it will be understood that a wide variety of shapes and sizes can be used for this display cover. As can be seen, one or more metal components 112 can be coupled to display cover 110 on its obverse side and toward the side and top edges of the display cover. Such metal components 112 can be arranged to form a "ring" around an outer portion of the display cover 110, and are preferably positioned such that when the display cover is installed, these metal items will be sufficiently close to the magnets disposed on the display device assembly, the outer housing and/or elsewhere on the computing device, with these components being set forth in greater detail above.

Metal components or ring 112 can be made up of one or many pieces of a suitably magnetically engaging metal, such as, for example, steel, although other types of metal may certainly be used. Metal ring 112 can be affixed or otherwise coupled to the obverse face or backside of display cover 110, such as by using any suitable glue or other adhesive. As one particular example, a VHB (Very High Bond) acrylic foam tape made by the 3M Company of St. Paul, Minn. is thought to work well for adhering the one or more metal components 112 to the obverse face of display cover 110. Other techniques can also be used to couple metal components or ring 112 to display cover 110 in suitable locations, as will be readily appreciated.

Although the location of metal ring 112 on display cover 110 is preferably toward the far edges of the display cover, it is preferable that these metal components be hidden from view as best as possible to prevent a more aesthetically pleasing final appearance. Accordingly, metal components or ring 112 can be set back from the far edges of display cover 110 an amount sufficient to allow for the wall distal edges of the outer housing to contact the extreme fringe portions of display cover 110, rather than the metal ring. Under such an arrangement, the side view of the computing device is presented as the distal edge portions 111 of display cover 110 and then the side wall 124 of outer housing 120, with no visible metal component 112 sandwiched therebetween. To facilitate such an arrangement, a small offset 113 from the distal edge 111 of the display cover 110 can be observed with respect to the placement of the one or more metal components or ring 112. Such an offset 113 can be equal to or slightly larger than the thickness of the outer housing side wall 124. A similar offset can be observed with respect to top wall 125 and any other contact interface between the outer housing and the display cover, as may be desired.

In addition to metal components 112 being disposed toward the edges, display cover 110 may also have a stabilizer assembly 160 coupled thereto. Stabilizer assembly 160 can be formed from any of a number of materials, such as plastic, glass or metal. Although stainless steel is thought to work well due to its favorable material properties, stability, price and ease of manufacture, other more magnetically interactive metals might also be used in the event that additional magnets (not shown) are also employed to engage such a stabilizer assembly. Similar to that which is done for metal components 112, stabilizer assembly 160 can be affixed to the obverse face of display cover 110 through any number of suitable means. Again, a VHB tape is thought to work well for this purpose. In order to engage effectively the ledge 150 (and its various gaps 151) that is coupled to the outer housing 120, as set forth above, stabilizer assembly 160 can have a number of downward descending hooks 161 or other similar components. As will be readily appreciated, an effective engagement of hooks 161 within gaps 151 results in restricting any lateral or side-to-side motion of the display cover 110 with respect to outer housing 120.

Referring now to FIG. 4B, stabilizer assembly 160 can be effectively coupled and positioned to the obverse face of the display cover 110 in such a manner so as to permit contact from the bottom edge of the display cover or glass to the upper surface of the chin portion of the outer housing. As shown, contact interface 170 between display cover 110 and bottom chin region 121 can be a fully flush contact between two finely machined or formed components, resulting in no discernable gap between them. In addition, display cover 110 and bottom chin region 121 can be arranged such that their respective faces are coplanar. The respective couplings and engagements of stabilizer assembly 160 and ledge 150 can be with respect to the backsides of both display cover 110 and chin region 121. In this manner, ledge 150 and stabilizer assembly 160 can be more readily hidden from view during the ordinary use of display cover 110 and computing device 100.

In order to mask or hide the various components coupled to the display cover 110, a masking layer 114 may be provided on the display cover itself. Such a masking layer can be a black or otherwise opaque ink that is printed or otherwise disposed onto the obverse face of the display cover in the general shape of an outer frame. Of course, other items besides ink may be used for such a masking purpose. Alternative arrangements can include a masking layer that is separate from the cover glass itself, although such arrangements can be inferior or more cumbersome than a simple printed ink layer. Masking layer 114 can be formed on the backside of the display cover 110 such that an opaque band is formed along some or all edges of the display cover. For example, a one to two inch wide black ink band from the edge inward and disposed around the entire circumference of obverse face display cover 110 may be suitable to hide or mask all metal ring components 112, magnets 140, stabilizer assembly 160 and any potentially visible portions of display screen assembly 131 that are not the actual display screen 130. Of course, other dimensions are also possible, and such an masking layer can be less than one inch or greater than two inches wide, as may be desired. In addition to hiding or masking any such unattractive items, masking layer 114 can provide an aesthetically pleasing "frame" or viewing portion through which much or all of the display screen is visible.

Because the new geometries of the outer housing to display cover interface and their supporting components are so different than their conventional counterparts, one unfortunate consequence is that the outer housing directly contacts the display cover in several locations. In particular, the front facing distal edges 127 of side walls 124 and top wall 125 of outer housing 120 abut the obverse face of display cover 110 around its outer edge. Since preferred embodiments include an outer housing made out of metal and a display cover made out of glass, this can present problems with respect to the housing scratching or damaging the cover glass. Such problems can be exacerbated where an ink or other masking layer is printed or otherwise disposed on the obverse face of the display cover right where such metal housing to display cover contact is contemplated. As such, one or more additional protective components may be used to protect the display cover and/or ink or masking layer disposed thereupon.

As shown in FIG. 4A, a protective layer 115 can be disposed atop the obverse face of display cover 110, and preferably atop masking layer 114. Such a protective layer can be printed or otherwise formed on the display cover itself, or can alternatively be a separate layer, sheet or gasket sandwiched between the display cover and outer housing. In some embodiments, protective layer 115 can be a Mylar sheet or gasket disposed between the inked display cover and outer housing, such that the ink and cover glass are protected thereby. Such a protective layer 115 can be sized, positioned and otherwise adapted to prevent or reduce damage resulting from the housing contacting the display cover and/or any ink or other masking layer, particularly where the housing is metal.

Continuing next with FIG. 5, the fully assembled exemplary computing device of FIG. 2A is shown in partial top cross-sectional view. Again, computing device 100 generally comprises a display cover 110, outer housing 120 and display screen 130 that is visible through the display cover, among various other components. Outer housing can include various portions, such as side wall 124 and back wall 128. Side wall 124 can have a front facing distal edge 127 that is positioned to contact a rim or end region of display cover 110 in a manner such that a thickness or distal edge 111 of the display cover is the distal edge that is exposed. As noted above, such an arrangement provides for a distinctive overall appearance in the display presentation that is aesthetically pleasing while remaining fully functional.

As noted previously, display screen 130 is part of a display screen assembly or chassis 131, which is stably installed within outer housing 120. This display screen assembly 131 can provide support for various display or supporting brackets 141 that hold or otherwise provide support for one or more magnets 140. Such magnets 140 provide an attraction force against one or more metal components or metal ring 112 that is coupled to display cover 110, such that the display cover is held in place while installed due at least in part to these magnets and metal ring. Although actual contact from one or more magnets to the display cover and its respective layers is possible, it will be readily appreciated that such contact is not necessary for a magnetic pulling force to be useful. Such a pulling force generally restricts the display cover from falling outward and away from the computing device, such as about a pivot axis along the bottom edge of the display cover.

As also noted above, and also shown in FIG. 5 here, an ink or masking layer 114 can be disposed on the obverse side of display cover 110, while a Mylar or other protective layer 115 can be positioned between the masking layer and the front distal edge 127 of outer housing 120. Protective layer 115 may also provide protection for the display cover 110 and any masking layer 114 in the event that one or more magnets 140 actually contact the display cover.

Figure 6:
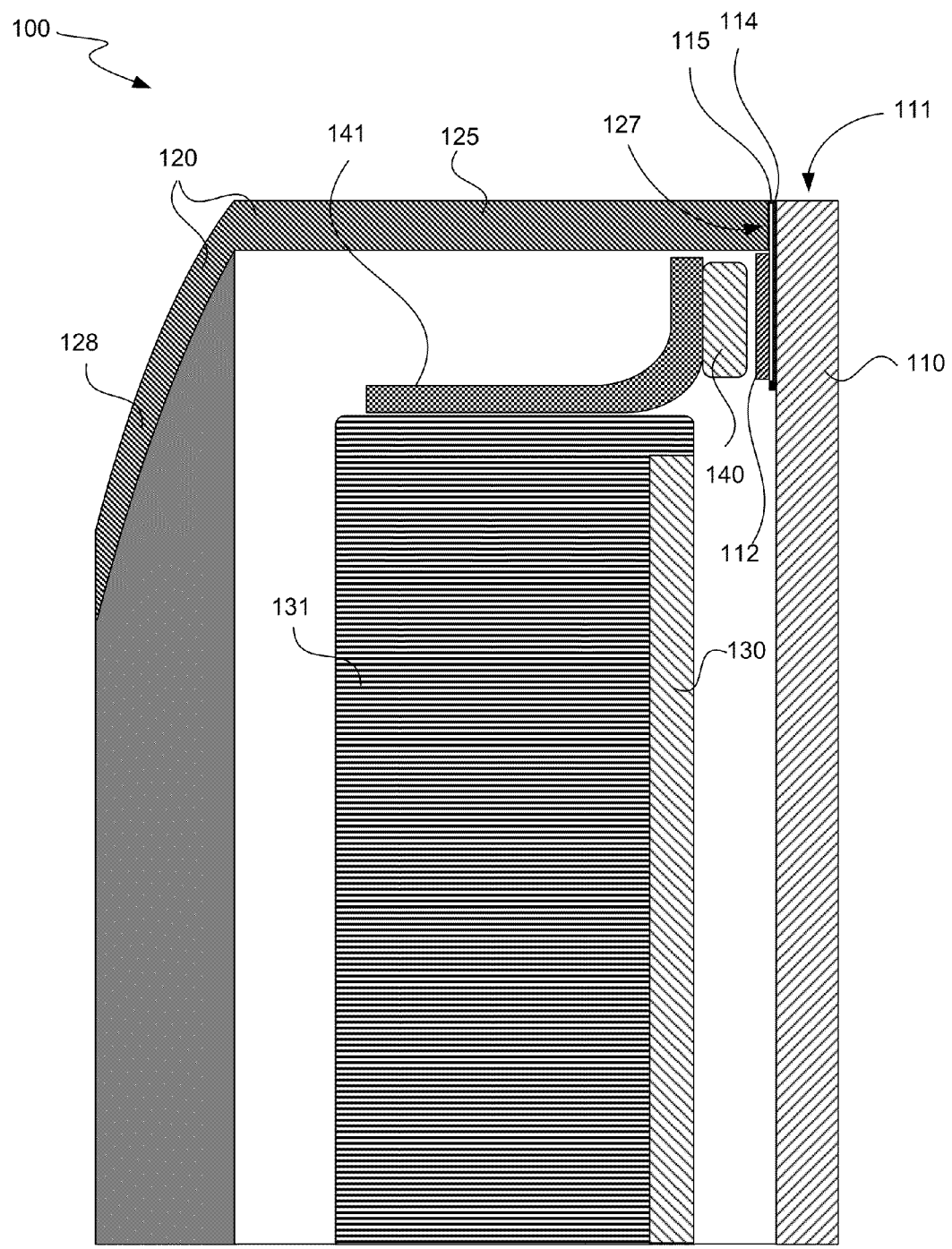
FIG. 6 illustrates in partial side cross-sectional view the fully assembled exemplary computing device of FIG. 2A according to one embodiment of the present invention.

Next, FIG. 6 depicts in partial side cross-sectional view the fully assembled exemplary computing device provided for illustrative purposes herein. Again, computing device 100 generally comprises a display cover 110, outer housing 120 and display screen 130, with outer housing having various portions such as top wall 125 and back wall 128. Similar to the side wall or walls, top wall 125 can also have a front facing distal edge 127 that is positioned to contact a rim or end region of display cover 110 in a manner such that a thickness or distal edge 111 of the display cover is exposed. Similar display bracket 141 and magnet 140 arrangements can be used to support magnets along the top of display screen assembly 131, such magnets being positioned to attract the portion of metal ring 112 that is disposed along the top rim portion of display cover 110. Again, masking layer 114 and protective layer 115 can be appropriately positioned between the display cover 110 and the front distal edge 127 of top outer housing wall 125.

Figure 7A:
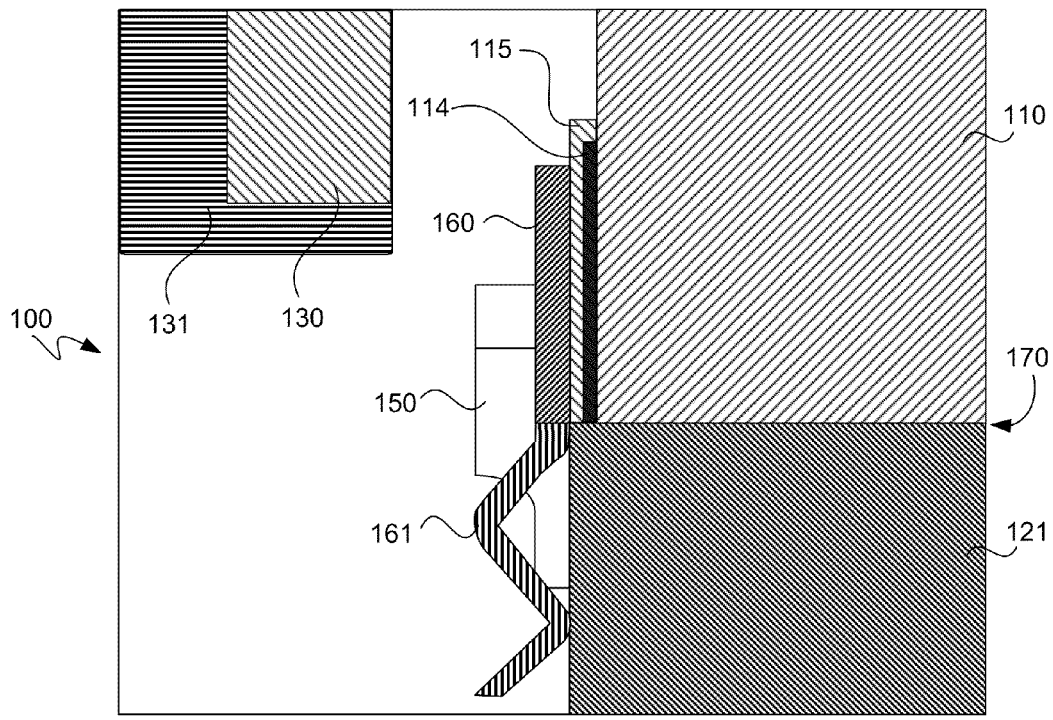
FIG. 7A illustrates in partial side cross-sectional view one section of the bottom chin region of the fully assembled exemplary computing device of FIG. 2A according to one embodiment of the present invention.
Figure 7B:
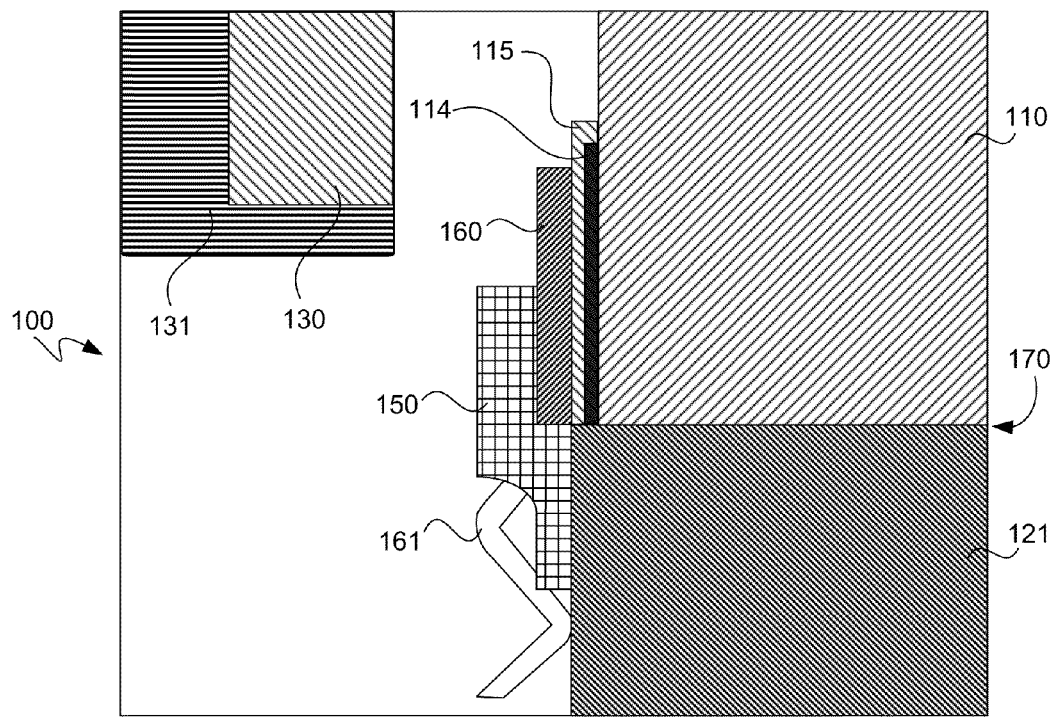
FIG. 7B illustrates in partial side cross-sectional view an alternative section of the bottom chin region of the fully assembled exemplary computing device than that shown in FIG. 7A according to one embodiment of the present invention.

For purposes of detail, FIG. 7A shows one section of the bottom chin region of the fully assembled computing device in partial side cross-sectional view, while FIG. 7B shows a different section of the bottom chin region, also in partial side cross-sectional view. As noted above, bottom chin 121 of outer housing 120 provides substantial support to the weight of display cover 110, which contacts and rests atop the bottom chin. As such, any downward movement of display cover 110 with respect to outer housing 120 is restricted by the bottom chin 121. A protective layer (not shown) may be used between these two items, although such a protective layer is not thought to be necessary. In any event, the appearance of a flush, tight fit with no gap between display cover 110 and bottom chin 121 is preferred, as is a coplanar arrangement with the front faces of the display cover and bottom chin. As also shown above, a masking layer 114 and protective layer 115 can be appropriately positioned between the obverse side of display cover 110 and bottom toothed ledge 150.

Although support from the various bracket, magnet and metal ring arrangements discussed above helps to prevent the display cover from falling away from the display screen and housing, components having even stronger support can be used to prevent relative lateral movement between the display cover and outer housing. As such, a toothed ledge 150 can be affixed or otherwise coupled to the back of bottom chin region 121 of the outer housing, and extend upward from the backside of the chin. Similarly, an engaging stabilizer assembly 160 can be affixed or otherwise coupled to the obverse side and bottom rim portion of the display cover 110, and may have portions that extend downward therefrom. As in the case of metal ring 112 above, ledge 150 can be attached to chin 121 and stabilizer assembly 160 can be firmly attached to display cover 110 by using VHB tape. However, it will be readily appreciated that any of a variety of adhesives may be used to affix such components. Furthermore, various alternative coupling mechanisms might instead be used, such as where disengaging stabilizer assembly 160 from display cover 110 or ledge 150 from chin 121 may be desirable.

One or more spring hooks 161 can attach to and descend downward from the stabilizer assembly 160, such that these spring hooks can fit into and engage one or more gaps 151 located in ledge 150. Such an arrangement can resemble interleaved fingers between the stabilizer assembly and ledge, such that lateral motion between the stabilizer and ledge is restricted. Where these items are then affixed or otherwise firmly coupled to the display cover and housing respectively, lateral motion between these items is similarly restricted. Ledge 150, stabilizer assembly 160 and spring hooks 161 may be comprised of any suitable sturdy material, such as, for example, stainless steel.

Accordingly, display cover 110 is secured in place and supported by a combination of: housing chin to display cover bottom edge contact, magnet to metal ring attraction, and stabilizer to ledge engagement, among other possible forces. Although it is believed that the foregoing elements and interactions are more than sufficient to provide the necessary security and support for the display cover when it is properly installed, other types of security or support items may also be provided either in addition to or in place of the foregoing examples.

For example, a series of holes (not shown) can be created in the obverse face of the display cover, such as along the masked outer frame region, and a series of mating pins or posts (not shown) mounted on the display screen assembly and/or outer housing can insert into these holes and provide support for the support cover when the display cover is installed. Alternatively, pins or posts can be coupled to the obverse side of the display cover and mating hole components therefor can be strategically placed about the display screen chassis and/or outer housing. In addition to providing support, or even in instance where little support is provided, such pin to hole arrangements can also serve as guides or reference points to facilitate a proper placement and location of the display cover when it is installed. For example, a small guide pin hole or bump cavity can be located near the edge of each corner of the display cover, with a corresponding small guide pin or bump being mounted about the display screen assembly for each guide pin.

Figure 8:
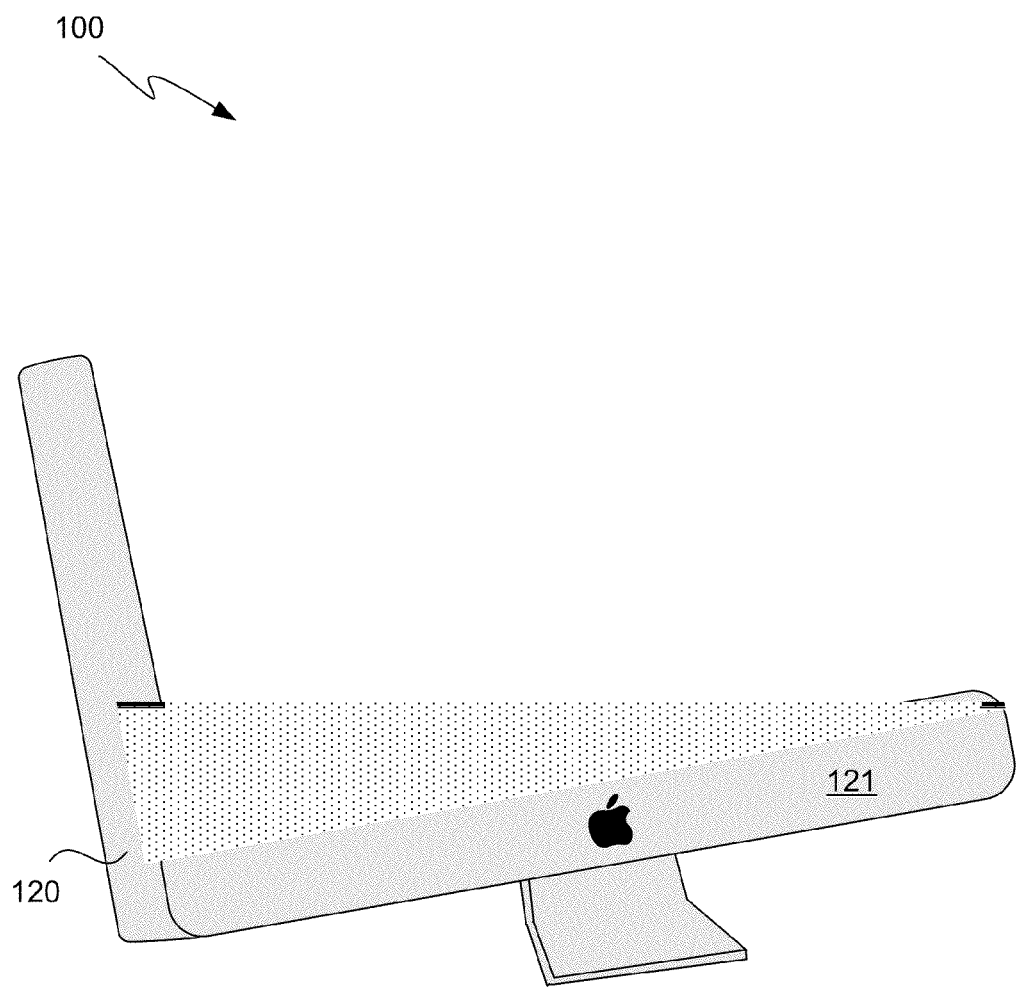
FIG. 8 illustrates in front perspective view an exemplary computing device with a display cover partially installed according to one embodiment of the present invention.

To provide additional perspective, an exemplary computing device with a display cover partially installed according to one embodiment of the present invention is shown in front perspective view in FIG. 8. Computing device 100, which can be identical or substantially similar to computing device 100 in the foregoing figures and description, includes an outer housing 120 having a bottom chin portion 121 and a display screen 130 within a display screen assembly 131 that is fully disposed within the outer housing. Outer housing 120 has a large opening 129 in its front area above bottom chin portion 121, which large opening is suitable for accepting and supporting a display cover 110. As shown, display cover 110 is partially installed, with its bottom edge resting atop chin portion 121 of housing 120 and its top edge projecting forward and away from the display screen and computing device 100. The illustrated position of display cover 110 is that which might typically be utilized by a user during the process of removing or installing the display cover.

In addition, the various spring hooks 161 of stabilizer assembly 160, which is attached along the bottom backside of display cover 110, are engaging the teeth and gaps of ledge 150, which is attached along the upper backside of bottom chin region 121. As shown, the engagement of stabilizer assembly 160 and ledge 150 prevents any lateral or side-to-side motion of the display cover at this point of an installation process. As will be readily appreciated, however, display cover 110 is still free to rotate or pivot about an axis along its bottom edge, since the interaction of the engaged hooks 161 and gaps 151 only prevents motion in a lateral direction, but not in a rotational direction for the display cover. Accordingly, the display cover 110 can generally rotate about its bottom edge, or an axis relatively close thereto, such that the top of the display cover moves upward toward and eventually contacts the front distal edge 127 of top wall 125. As noted above, various magnet 140 and metal ring 112 arrangements then serve to secure and support the display cover 110 in such a position once the display cover is raised up to contact the front edge of top wall 125.

Cover to Housing Interface Embodiment II

Figure 9A:
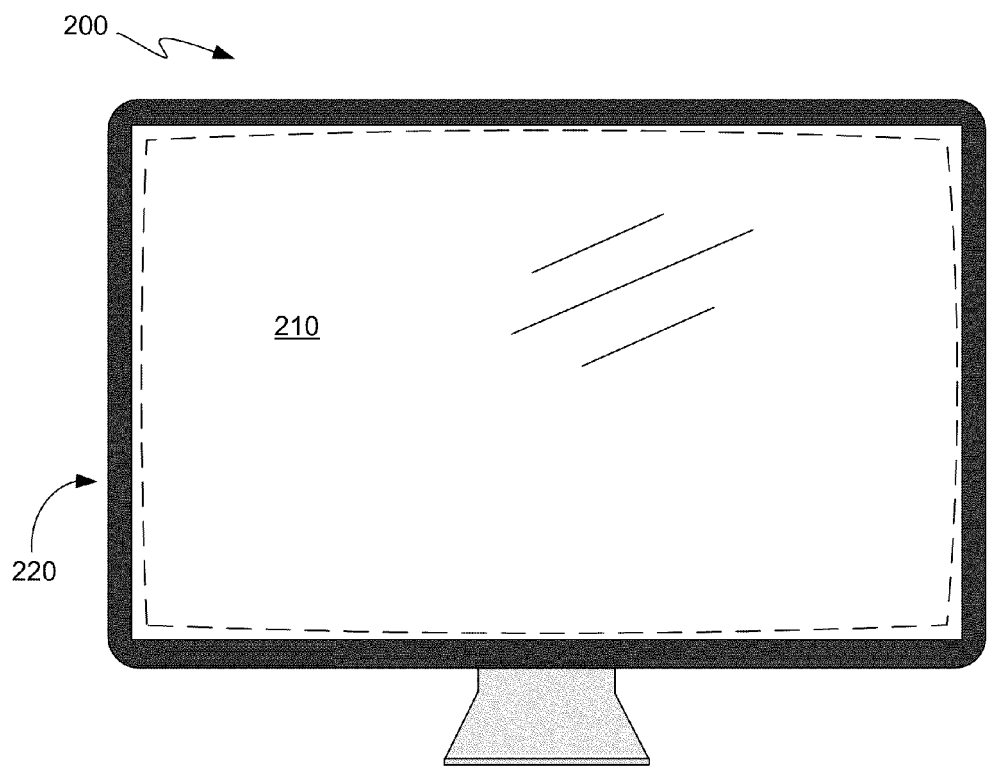
FIG. 9A illustrates in front elevation view an alternative exemplary computing device having an oversized display screen presentation utilizing a display screen to housing interface according to one embodiment of the present invention.
Figure 9B:
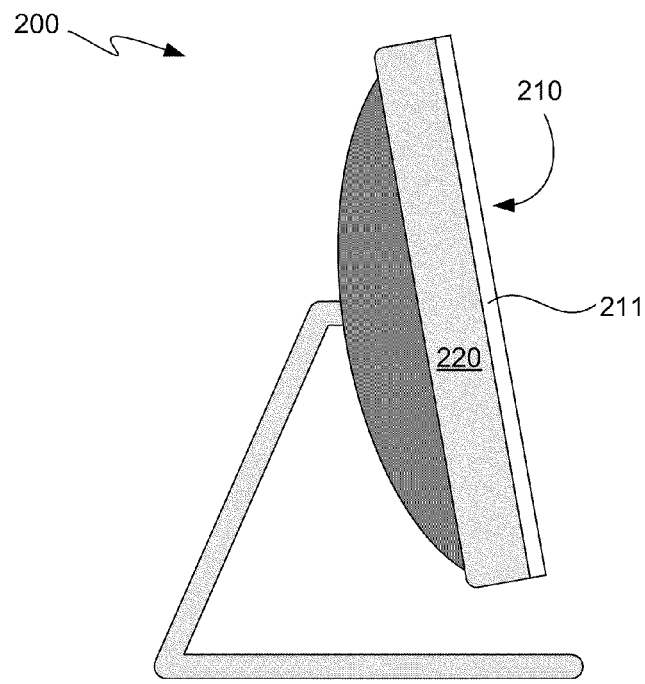
FIG. 9B illustrates in side elevation view the alternative exemplary computing device of FIG. 9A according to one embodiment of the present invention.

Although sufficient details have been provided above with respect to one particular way of creating a display cover to outer housing interface that results in a display cover having exposed outside edges and a "floating" appearance, it will be readily appreciated that such an appearance can be created using a variety of alternative components and techniques. Turning next to FIGS. 9A and 9B, an alternative exemplary computing device having an oversized display screen presentation utilizing a display screen to housing interface is illustrated in front elevation and side elevation views respectively according to an alternative embodiment of the present invention. Computing device 200 can be substantially similar to computing device 100 in the foregoing examples, with a few notable exceptions. Of course, other differences may be implemented too, and not all differences need be changed, as may be desired for any particular design.

Similar to the foregoing embodiment, computing device 200 has a display cover 210 and an outer housing 220 that interface to present one or more exposed edges 211 of the display cover. Rather than have any bottom chin portion for its housing, however, computing device 200 is arranged such that all or substantially all of the distal side edge 211 of its display cover 210 is exposed to the outside of the device. In this particular example, this means that all four sides—top, left side, right side and bottom—are exposed and to not rest flush against the housing or any other device surface. Such an arrangement results in a display cover 210 that appears to be "completely floating" with respect to outer housing 220.

To enable the support of such a fully exposed display cover, additional and/or more powerful magnets (internal and not shown) may be disposed about the display screen chassis, outer housing and/or other stable device components. In particular, a number of magnets and ring metal components can be disposed along a bottom edge of the obverse side display cover 210. In addition, a number of support pins or posts (internal and not shown) can be mated with corresponding holes in the display cover, with the number, size and depth of the pins and holes reflecting the amount of device weight and support that is needed. As one particular possibility, one or more hooks or similar items can be bonded along the outer frame area on the obverse face of display cover 210, with such hooks being inserted into appropriate locking holes located within the outer housing itself or suitable supported brackets that are positioned for such a purpose. When used with an appropriate number of magnet and ring metal components as detailed in the above examples, such hook to locking hole arrangements can be particularly effective in locking a display cover in place that has all distal edges exposed and "floating." In the event that further support or locking is needed to provide a removable display cover that still has four or all side edges exposed to create a "floating" appearance, one or more screws or other simple fastening items may also be employed, as will be readily appreciated.

Cover to Housing Interface Embodiment III

Figure 10:
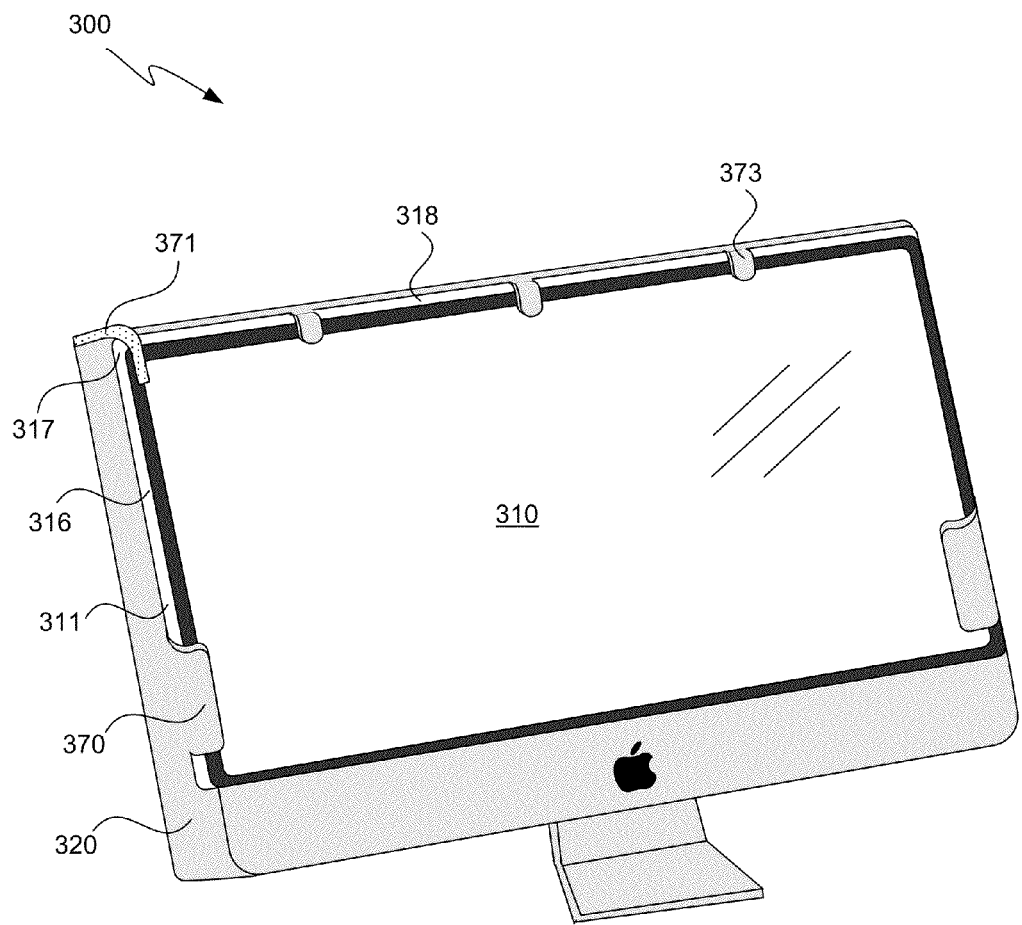
FIG. 10 illustrates in top perspective view another exemplary display screen to housing interface according to one embodiment of the present invention.

As yet another exemplary embodiment, FIG. 10 illustrates in top perspective view another display screen to housing interface according to another alternative embodiment of the present invention. Display device 300 can be substantially similar in many regards to Computing devices 100 and 200. In particular, display device can have a display cover 310 and an outer housing 320 that is adapted to interface with and support the display cover. Unlike the foregoing embodiments, however, display device 300 presents an arrangement where only portions of the overall distal side portion 311 of display cover 310 are exposed or visible to the outside of the device.

For example, the distal side region 316 has an upper portion that is exposed to the outside of the device, but a lower region that is protected by and encased within a wrap around feature 370 in outer housing 320. As another example, a relatively small corner bracket 371 can be used to secure an otherwise exposed distal edge corner 317 of the display cover 310. As yet another example, a series of thin support fingers 373 can be disposed at intervals along an otherwise exposed top distal edge portion 318 of the display cover 310. Such minimally obtrusive support mechanisms can be used alone or in any combination to result in a display cover outer distal edge portion or thickness that is substantially exposed in most but not all locations. Use of one or more of these particular mechanisms, or similar mechanisms, can allow for significant exposure of the distal side edges of the display cover without necessarily requiring a significant amount of other support mechanisms. In addition, such support mechanisms may prove particularly useful with respect to handheld personal computing devices or other devices that are not able to rely upon a bottom chin portion, as in device 100 above.

As yet another alternative to the various foregoing embodiments, a glass, plastic or otherwise transparent or translucent bezel or other component may be employed. Such a bezel or other support mechanism can provide support for a display cover having distal edge portions that are visible through the transparent bezel or support mechanism. Such an arrangement may provide an additional advantage where it is desired that the distal edge thickness of the display cover be visible without actually exposing the distal edge. That is, the bezel can support and cover the side distal edge of the display cover, but allow it to be seen therethrough. Where actual exposure of the display cover side distal edge is desired, however, then one or more of the foregoing arrangements may be utilized.

Methods of Use

Figure 11:
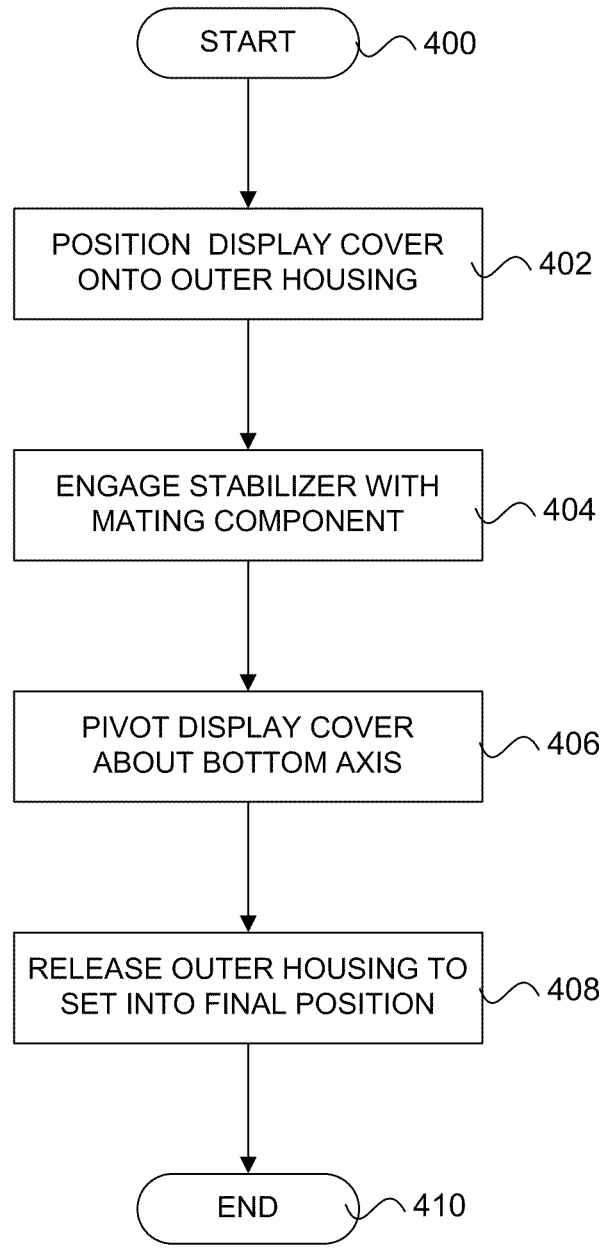
FIG. 11 presents a flowchart of an exemplary method of placing a display cover onto a computing device having a display screen according to one embodiment of the present invention.

Because the various foregoing display covers are intended to be removable in many instances, and because various new types of support items and interfaces have been introduced herein, it should be appreciated that some ways of installing and removing such display covers are preferable. Turning lastly to FIG. 11 a flowchart of one exemplary method of placing a display cover onto a computing device having a display screen according to one embodiment of the present invention is provided. While the provided flowchart may be comprehensive in some respects, it will be readily understood that not every step provided is necessary, that other steps can be included, and that the order of steps might be rearranged as desired by a given device manufacturer, vendor or user.

After start step 400, a user can position a bottom edge of a display cover at process step 402 onto a bottom chin portion of an outer housing having a display screen housed therein. The display cover can be positioned in such a manner that the bottom chin portion provides a primary support for the display cover and its weight. At subsequent process step 404, a stabilizer assembly that is affixed to and along the bottom edge of the display cover can be engaged with one or more mating components coupled to the bottom chin portion of the outer housing. Such an engagement between these items preferably restricts any relative lateral or side-to-side movement between the display cover and the outer housing.

At following process step 406, the display cover can be pivoted, rotated or otherwise moved toward the display screen about an axis of rotation that is along or about the bottom edge of the display cover. At the next process step 408, the display cover can be released such that an upper portion thereof is supported by one or more secondary supports located on the computing device itself. Such secondary supports can be, for example, one or more magnets that provide an attraction force to one or more metal components coupled to the rim portions of the display cover, as set forth in greater detail above. As such, releasing step 408 may include a step of permitting a plurality of magnets located on the computing device to attract one or more metal items located on the display cover. The final positioning of the display cover after step 408 results in a substantial amount of the side thickness or distal edge portion of the display cover being exposed to the outside of the computing device, which provides for a distinctive visual appearance. The method then ends at end step 410.

As suggested above, the disclosed method can include the placement of a display cover has a square or rectangular shape, and can result in the side thickness or distal edge region of the display cover being exposed on at least two different sides of the square or rectangle. In some embodiments, such exposure can be had with respect to three or even four entire sides of the square or rectangle.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A computer enclosure system, comprising:
   a display cover adapted to be placed proximate to an associated display screen such that said display screen is visible through a viewing portion thereof, said display cover having a front face, an obverse face and a distal edge portion between the front and obverse faces and around a circumference thereof;
   an outer housing adapted to contain the display screen and provide support for the display cover while the display cover is placed proximate to the display screen such that at least a portion of the display cover distal edge portion is fully exposed to the outside of said enclosure system while such support is provided; and
   one or more support components adapted to hold the display cover in place with respect to the metal housing, said one or more support components restricting relative movement of the display cover in a direction substantially perpendicular to the front face.

2. The computer enclosure system of claim 1, further including:
   a protective layer situated between said outer housing and the obverse face of said display cover, said protective layer being adapted to prevent or reduce damage resulting from said outer housing contacting said display cover.

3. The computer enclosure system of claim 1, further including:
a stabilizer assembly affixed to and along an outer edge of said display cover, said stabilizer assembly being adapted to couple to at least a portion of said outer housing such that relative side-to-side movement between the display cover and the outer housing is restricted.

4. The computer enclosure system of claim 1, wherein said display cover is readily removable from said outer housing.

5. The computer enclosure system of claim 1, further including:
one or more pieces of metal coupled to the obverse face of said display cover, wherein said one or more support components comprises a plurality of magnets coupled to the outer housing and arranged to hold said display cover in place by exerting an attraction force on said one or more pieces of metal.

6. The computer enclosure system of claim 1, wherein said outer housing comprises a bottom chin portion adapted to reside directly beneath and to support said display cover, wherein the front of said bottom chin portion extends further away from said display screen than any other portion of said outer housing.

7. A computing device, comprising:
a display screen;
a display cover positioned proximate to the display screen such that at least a portion of the display screen is visible therethrough, said display cover having a front face, an obverse face and a distal edge portion between the front and obverse faces and around a circumference thereof; and
an outer housing containing the display screen and providing support for the display cover, wherein the support comprises a force interaction between said outer housing and said display cover such that at least some of the display cover distal edge portion is fully exposed to the outside of said computing device while such support is provided.

8. The computing device of claim 7, wherein said display cover has a square or rectangular shape, and wherein said distal edge portion is exposed on at least two different sides of the square or rectangle.

9. The computing device of claim 8, wherein said distal edge portion is exposed on at least three entire sides of the square or rectangle.

10. The computing device of claim 7, further including:
one or more support components that hold the display cover in place with respect to the outer housing, said one or more support components restricting relative movement of the display cover in a direction substantially perpendicular to the front face of the display cover; and
a stabilizer assembly affixed to and along a bottom outer edge of the display cover, said stabilizer assembly being adapted to couple to at least a portion of the outer housing such that relative side-to-side movement between the display cover and the outer housing is restricted.

11. The computing device of claim 7, wherein a front portion of said outer housing and the front face of said display cover are coplanar.

12. A cover glass to housing interface system, comprising:
a cover glass adapted to be placed proximate to an associated display screen such that the display screen is visible therethrough, the cover glass having a front face, an obverse face and a distal edge portion between the front and obverse faces and around at least a portion of a circumference thereof; and
a housing adapted to contain the display screen and provide support for the cover glass while the cover glass is placed proximate to the display screen, wherein at least part of the cover glass distal edge portion is fully exposed to the outside of said cover glass to housing interface system while such support is provided.

13. The cover glass to housing interface system of claim 12, wherein said cover glass is made of glass and said housing is made of metal.

14. The cover glass to housing interface system of claim 12, wherein the full thickness of said cover glass is exposed and visible from the side when said cover glass to housing interface system is viewed directly from the side.

15. The cover glass to housing interface system of claim 12, wherein said cover glass can be readily removed from said housing.

16. A method of placing a display cover onto a computing device having a display screen, the method comprising:
positioning a bottom edge of a display cover onto a bottom ledge portion of an outer housing having a display screen housed therein, wherein said display cover is positioned such that said bottom ledge portion provides a primary support therefor;
pivoting said display cover toward said display screen about an axis of rotation that is substantially along said bottom edge of the display cover; and
releasing said display cover such that an upper portion thereof is supported by one or more secondary supports located on the computing device.

17. The method of claim 16, wherein said step of releasing includes permitting a plurality of magnets located on the computing device to attract one or more metal items located on the display cover.

18. The method of claim 16, wherein the final position of said display cover results in a substantial amount of the side thickness of said display cover being exposed to the outside of the computing device.

19. The method of claim 18, wherein said display cover has a square or rectangular shape, and wherein the side thickness of said display cover is exposed on at least two different sides of the square or rectangle.

20. The method of claim 16, further including the step of:
engaging a stabilizer assembly coupled to the bottom edge of said display cover with one or more mating components coupled to said bottom ledge portion of the outer housing, wherein said engaging restricts relative side-to-side movement between the display cover and the outer housing.

* * * * *